(12) United States Patent
Mizutani

(10) Patent No.: US 10,382,001 B2
(45) Date of Patent: Aug. 13, 2019

(54) CONDUCTIVE PATH WITH NOISE FILTER

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventor: Yoshio Mizutani, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-Shi, Osaka (JP)

( * ) Notice: Subject to any disclaimer, the term of this patent is extended or adjusted under 35 U.S.C. 154(b) by 5 days.

(21) Appl. No.: 15/738,961

(22) PCT Filed: Aug. 27, 2015

(86) PCT No.: PCT/JP2015/074239
§ 371 (c)(1),
(2) Date: Dec. 21, 2017

(87) PCT Pub. No.: WO2017/006497
PCT Pub. Date: Jan. 12, 2017

(65) Prior Publication Data
US 2018/0183400 A1    Jun. 28, 2018

(30) Foreign Application Priority Data
Jul. 9, 2015 (JP) .................................. 2015-137832

(51) Int. Cl.
*H03H 7/01* (2006.01)
*H05K 9/00* (2006.01)
(Continued)

(52) U.S. Cl.
CPC ....... *H03H 7/0115* (2013.01); *B60R 16/0207* (2013.01); *B60R 16/0215* (2013.01);
(Continued)

(58) Field of Classification Search
CPC ... H03H 7/0115; H03H 1/0007; H05K 9/0098
(Continued)

(56) References Cited

U.S. PATENT DOCUMENTS

| 2,421,137 | A | * | 5/1947 | Wheeler | ............ | H01B 11/1895 |
| | | | | | | 333/244 |
| 2007/0075811 | A1 | * | 4/2007 | Baldwin | ................ | H01B 12/02 |
| | | | | | | 336/5 |

FOREIGN PATENT DOCUMENTS

| JP | H10117083 A | 5/1998 |
| JP | 2006080215 A | 3/2006 |
| JP | 2011018529 A | 1/2011 |

OTHER PUBLICATIONS

International Search Authority for Application No. PCT/JP2015/074239 dated Oct. 6, 2015; 5 pages.

* cited by examiner

*Primary Examiner* — Rakesh B Patel
(74) *Attorney, Agent, or Firm* — Reising Ethington, P.C.

(57) ABSTRACT

A conductive path with noise filter that enables an efficient reduction in a surge noise in a specific frequency band is provided. A conductive path with noise filter includes a conductive path main body, V-phase wire, W-phase wire, a coil-shaped inductor, V-phase inductor, W-phase inductor surrounding the conductive path main body, V-phase wire, W-phase wire, and a capacitor, V-phase capacitor, W-phase capacitor arranged between the conductive path main body, V-phase wire, W-phase wire and the inductor, V-phase inductor, W-phase inductor.

4 Claims, 5 Drawing Sheets

(51) Int. Cl.
  *H03H 7/09* (2006.01)
  *B60R 16/02* (2006.01)
  *H02M 7/00* (2006.01)
  H03H 1/00 (2006.01)
  H02J 3/01 (2006.01)
(52) U.S. Cl.
  CPC .............. *H02M 7/003* (2013.01); *H03H 7/09* (2013.01); *H05K 9/0049* (2013.01); *H05K 9/0098* (2013.01); *H02J 3/01* (2013.01); *H03H 1/0007* (2013.01); *H03H 7/175* (2013.01); *Y02E 40/40* (2013.01)
(58) Field of Classification Search
  USPC .................................. 333/181, 185; 336/170
  See application file for complete search history.

CONDUCTIVE PATH WITH NOISE FILTER

CROSS REFERENCE TO RELATED APPLICATIONS

This application claims the priority of Japanese patent application JP2015-137832 filed on Jul. 9, 2015, the entire contents of which are incorporated herein.

TECHNICAL FIELD

The present invention relates to a conductive path with noise filter.

BACKGROUND ART

Patent Document 1 (JP2010-126043A) discloses a technique in which a wire harness including three-phase AC wires is arranged between a motor and an inverter device in an electric vehicle, the wire harness is surrounded by a braided wire in order to take a measure against noise produced by the wire harness, and both ends of the braided wire are connected to a shielding case of the motor and a shielding case of the inverter device. Using the braided wire to shield the wire harness in this manner makes it possible to prevent noise produced by the motor, the inverter device, and the wire harness from affecting surrounding devices or circuits.

SUMMARY

However, it is difficult to efficiently reduce a surge noise in a specific frequency band produced by the inverter device by using a method of surrounding a wire harness using a braided wire.

The present design was accomplished based on the above-mentioned circumstances, and it is an object thereof to provide a conductive path with noise filter that enables an efficient reduction in a surge noise in a specific frequency band.

Solution to Problem

A conductive path with noise filter of the present design includes:
a conductive path main body;
a coil-shaped inductor surrounding the conductive path main body; and
a capacitor arranged between the conductive path main body and the inductor.

Setting the electrostatic capacitance of a capacitor, and setting the inductance of an inductor by varying the winding number, the length or the like of a coil make it possible to efficiently reduce a surge noise in a specific frequency band due to an LC resonance.

DESCRIPTION OF EMBODIMENTS

Figure 1:
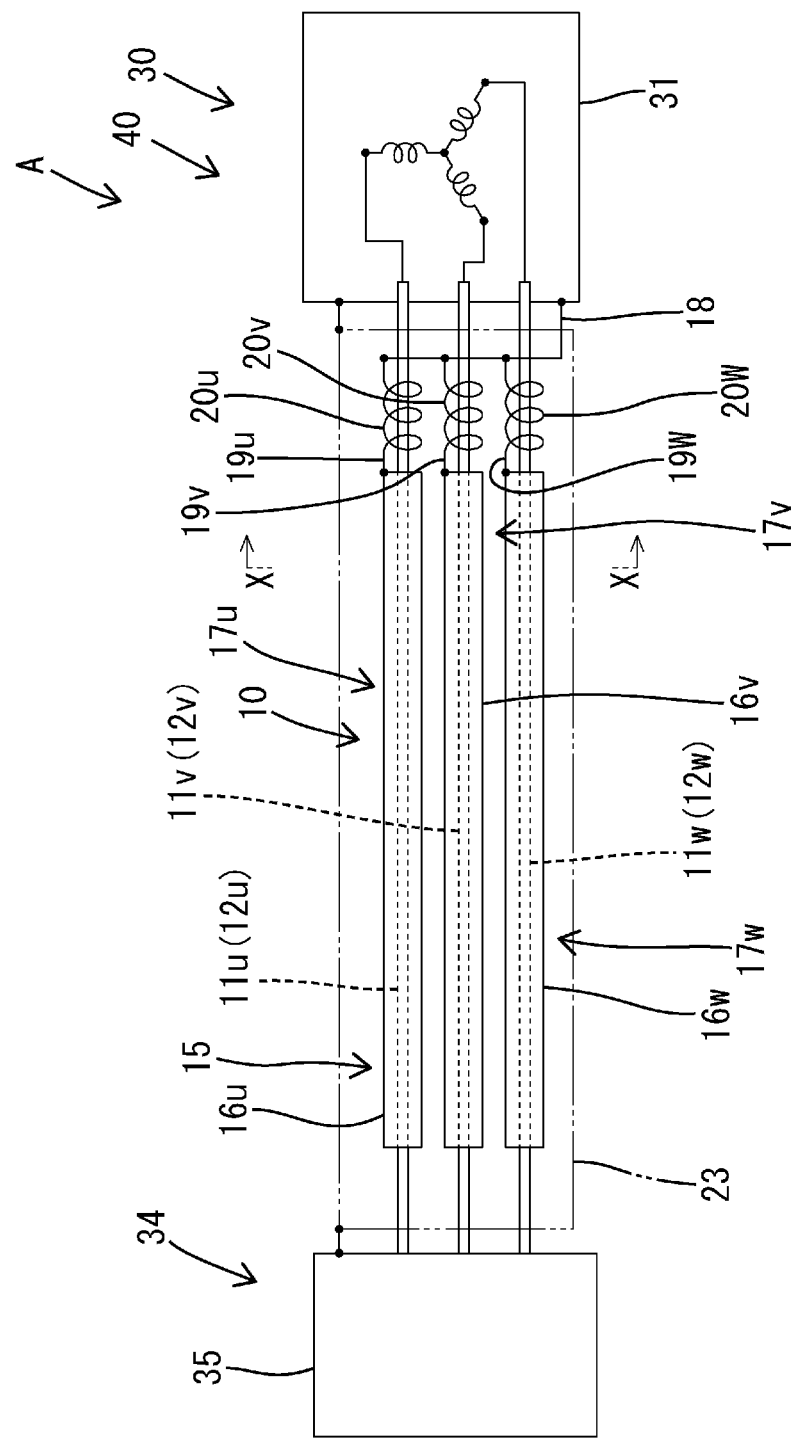
FIG. 1 is a configuration diagram of a conductive path with noise filter of Embodiment 1.

The conductive path with noise filter of the present design may also have a configuration in which a plurality of the conductive path main bodies are arranged in parallel, the plurality of the conductive path main bodies are each provided with the inductor, and the inductor is a conductive wire coated with an insulating layer. With this configuration, it is possible to prevent the inductors from coming into contact with each other without using dedicated insulating members.

The conductive path with noise filter of the present design may also have a configuration in which the conductive wire according to item (a) is a metal single-core wire. With this configuration, it is possible to keep the inductor in a predetermined coil shape without using other members due to an ability of the metal single-core wire to retain its shape by itself.

The conductive path with noise filter of the present design may also have a configuration in which a plurality of the conductive path main bodies are arranged in parallel, the plurality of the conductive path main bodies are respectively provided with a plurality of the capacitors connected in parallel, and the single inductor surrounds the plurality of the conductive path main bodies all together, and is connected to the plurality of the capacitors.

With this configuration, it is sufficient that only one inductor is used for a plurality of conductive path main bodies, thus making it possible to reduce the number of components.

The conductive path with noise filter of the present design may also include three of the conductive path main bodies constituting a three-phase AC circuit, three of the inductors respectively surrounding the three conductive path main bodies, and three of the capacitors respectively connected to the three inductors, and have a configuration in which the three capacitors are mutually connected via the inductors, the three capacitors are connected to only the inductors, and each of the inductors is connected to only one of the three capacitors and one of the remaining two inductors.

With this configuration, a surge current in each of the conductive path main bodies can be attenuated by the capacitor and the inductor and discharged to another capacitor, thus making it possible to reduce a common mode noise, which is of concern when the capacitor and the inductor are connected to a housing ground such as a motor case.

The conductive path with noise filter of the present design may also have a configuration in which a tubular shielding layer surrounds a plurality of the conductive path main bodies and the inductors all together, and the capacitor is arranged inside a shielded space surrounded by the shielding layer.

With this configuration, the size can be reduced compared with a case where the capacitor is provided on the outside of the shielding layer.

The conductive path with noise filter of the present design may also have a configuration in which the capacitor includes the conductive path main body, an insulating layer surrounding the conductive path main body, and a conductive layer provided to correspond to the conductive path main body with the insulating layer being sandwiched between the conductive layer and the conductive path main body.

With this configuration, a lead wire becomes unnecessary, thus making it unnecessary to connect the conductive path main body and a lead wire.

Embodiment 1

Figure 2:
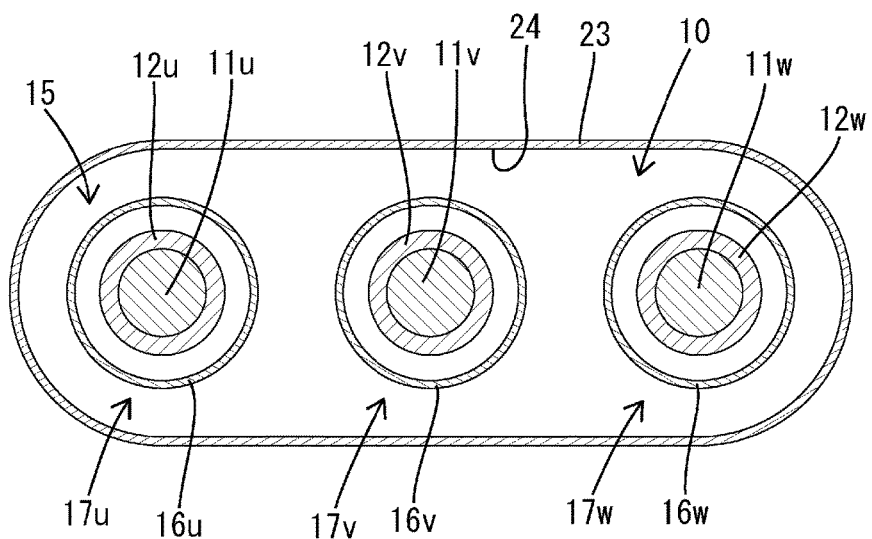
FIG. 2 is a cross-sectional view taken along line X-X in FIG. 1.
Figure 3:
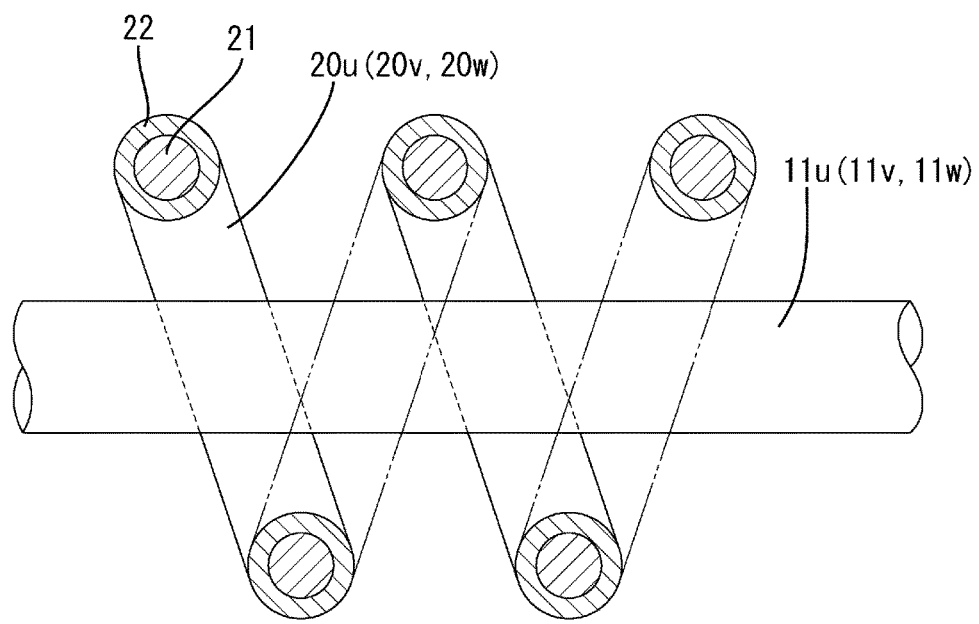
FIG. 3 is a cross-sectional view of an inductor.

Hereinafter, Embodiment 1 will be described with reference to FIGS. 1 to 3. A conductive path A with noise filter of Embodiment 1 is arranged between a motor 30 and an inverter device 34 mounted in an electric vehicle (not shown) such as an electric car or a hybrid car. In this electric vehicle, a housing ground 40 is constituted by a motor case 31 that is a housing of the motor 30, an inverter case 35 that is a housing of the inverter device 34, and a shielding layer 23 that connects the cases 31 and 35. The conductive path A with noise filter includes a U-phase wire 11u ("conductive path main body" in the claims), a V-phase wire 11v ("conductive path main body" in the claims) and a W-phase wire 11w ("conductive path main body" in the claims) that constitute a three-phase AC circuit 10, and a surge reducing filter 15 and the shielding layer 23.

The U-phase wire 11u, the V-phase wire 11v, and the W-phase wire 11w are each constituted by a stranded wire or a single-core wire made of metal (e.g., copper, a copper alloy, aluminum, or an aluminum alloy). The outer circumference of the U-phase wire flu is surrounded by a U-phase insulating coating 12u ("insulating layer" in the claims) made of a synthetic resin. The outer circumference of the V-phase wire 11v is surrounded by a V-phase insulating coating 12v ("insulating layer" in the claims) made of a synthetic resin. The outer circumference of the W-phase wire 11w is surrounded by a W-phase insulating coating 12w ("insulating layer" in the claims) made of a synthetic resin. Specifically, the U-phase wire 11u and the U-phase insulating coating 12u make up one coated electric wire. The V-phase wire 11v and the V-phase insulating coating 12v make up one coated electric wire. The W-phase wire 11w and the W-phase insulating coating 12w make up one coated electric wire.

The U-phase wire 11u, the V-phase wire 11v, and the W-phase wire 11w are arranged in parallel. One end of each of the U-phase wire 11u, the V-phase wire 11v, and the W-phase wire 11w is connected to an inverter circuit (not shown) of the inverter device 34. The inverter circuit is accommodated inside the conductive inverter case 35 having a shielding function. The other end of each of the U-phase wire 11u, the V-phase wire 11v, and the W-phase wire 11w is connected to the winding wires of the motor 30. The winding wires are accommodated inside the conductive motor case 31 having a shielding function.

The surge reducing filter 15 includes a tubular U-phase conductive layer 16u ("first conductive layer" in the claims), a tubular V-phase conductive layer 16v, and a tubular W-phase conductive layer 16w. Each of the U-phase conductive layer 16u, the V-phase conductive layer 16v, and the W-phase conductive layer 16w is made of metal (e.g., copper, a copper alloy, aluminum, or an aluminum alloy) and is not directly connected to the housing ground 40. The outer circumference of each of the U-phase conductive layer 16u, V-phase conductive layer 16v, and the W-phase conductive layer 16w is coated with an insulating coating, an insulating film, or the like.

The U-phase wire 11u and the U-phase insulating coating 12u are surrounded by the U-phase conductive layer 16u in a state of being in proximity to each other. In other words, their positional relationship is such that the U-phase conductive layer 16u and the U-phase wire 11u are in proximity to each other and face each other with the U-phase insulating coating 12u being sandwiched therebetween. Accordingly, the U-phase wire 11u, the U-phase insulating coating 12u, and the U-phase conductive layer 16u constitute a U-phase capacitor 17u ("capacitor" in the claims), and the U-phase wire 11u and the U-phase conductive layer 16u serve as electrodes.

Also, the V-phase wire 11v and the V-phase insulating coating 12v are surrounded by the V-phase conductive layer 16v in a state of being in proximity to each other. In other words, their positional relationship is such that the V-phase conductive layer 16v and the V-phase wire 11v are in proximity to each other and face each other with the V-phase insulating coating 12v being sandwiched therebetween. Accordingly, the V-phase wire 11v, the V-phase insulating coating 12v, and the V-phase conductive layer 16v constitute a V-phase capacitor 17v ("capacitor" in the claims), and the V-phase wire 11v and the V-phase conductive layer 16v serve as electrodes.

Similarly, the W-phase wire 11w and the W-phase insulating coating 12w are surrounded by the W-phase conductive layer 16w in a state of being in proximity to each other. In other words, their positional relationship is such that the W-phase conductive layer 16w and the W-phase wire 11w are in proximity to each other and face each other with the W-phase insulating coating 12w being sandwiched therebetween. Accordingly, the W-phase wire 11w, the W-phase insulating coating 12w, and the W-phase conductive layer 16w constitute a W-phase capacitor 17w ("capacitor" in the claims), and the W-phase wire 11w and the W-phase conductive layer 16w serve as electrodes.

The U-phase conductive layer 16u, the V-phase conductive layer 16v, and the W-phase conductive layer 16w are connected to the motor case 31 via a housing connection wire 18. The housing connection wire 18 includes a U-phase branch wire 19u connected to the U-phase conductive layer 16u, a V-phase branch wire 19v connected to the V-phase conductive layer 16v, and a W-phase branch wire 19w connected to the W-phase conductive layer 16w.

An intermediate portion of the U-phase branch wire 19u is provided with a coil-shaped U-phase inductor 20u included in the surge reducing filter 15. An intermediate portion of the V-phase branch wire 19v is provided with a coil-shaped V-phase inductor 20v included in the surge reducing filter 15. An intermediate portion of the W-phase branch wire 19w is provided with a coil-shaped W-phase inductor 20w included in the surge reducing filter 15. These three inductors 20u, 20v and 20w are star-connected by the three branch wires 19u, 19v and 19w, and connected to the housing ground 40 (motor case 31) via the housing connection wire 18.

Each of the inductors 20u, 20v and 20w is obtained by coating a conductive wire 21 constituted by a metal single-core wire with an insulating layer 22. The conductive wire 21 coated with the insulating layer 22 is shaped into a spiral shape, and surrounds the end portion on the motor 30 side of each of the U-phase wire 11u, the V-phase wire 11v, and the W-phase wire 11w. The conductive wire 21 shaped into a spiral shape retains its coil shape without using other members because it is constituted by a metal single-core wire.

The shielding layer 23 is a tubular metal member constituted by a braided wire or the like, for example. One end of the shielding layer 23 is located near the motor 30, and connected to the motor case 31 such that electrical conduction can be established. The other end of the shielding layer 23 is located near the inverter device 34, and connected to the inverter case 35 such that electrical conduction can be established. A space surrounded by the shielding layer 23 serves as a shielded space 24. The shielding layer 23 surrounds the U-phase wire 11u, the V-phase wire 11v, the W-phase wire 11w, the U-phase conductive layer 16u, the V-phase conductive layer 16v, and the W-phase conductive layer 16w all together.

Accordingly, the U-phase wire 11u, the V-phase wire 11v, the W-phase wire 11w, the U-phase inductor 20u, the V-phase inductor 20v, the W-phase inductor 20w, the U-phase capacitor 17u, the V-phase capacitor 17v, and the W-phase capacitor 17w (the U-phase conductive layer 16u, the V-phase conductive layer 16v and the W-phase conductive layer 16w) are accommodated in the shielded space 24. The motor case 31 and the inverter case 35 are connected to each other by the shielding layer 23. It should be noted that a conductive means for connecting the motor case 31 and the inverter case 35 is not limited to the shielding layer 23, and a stranded wire, a single-core wire, a vehicle body, or the like may also be used.

Next, the functions of this embodiment will be described. After the frequency of a surge voltage produced by the inverter device 34 has been determined, the lengths of the conductive layers 16u, 16v and 16w, the corresponding areas of the conductive layers 16u, 16v and 16w and the conductive path main body (the U-phase wire 11u, the V-phase wire 11v, the W-phase wire 11w), the distances between the conductive layers 16u, 16v and 16w and the conductive path main body (the U-phase wire 11u, the V-phase wire 11v, the W-phase wire 11w), the materials for the U-phase insulating coating 12u, the V-phase insulating coating 12v and the W-phase insulating coating 12w, and the like are selected as appropriate, setting the electrostatic capacitances of the U-phase capacitor 17u, the V-phase capacitor 17v and the W-phase capacitor 17w suitable for reducing a surge noise at the determined frequency. Regarding the U-phase inductor 20u, the V-phase inductor 20v, and the W-phase inductor 20w, the materials for and cross-sectional areas of the wires used therein, the winding numbers of the coils, and the like are selected as appropriate, setting their inductances suitable for reducing a surge noise at the determined frequency.

When the electrostatic capacitances of the three capacitors 17u, 17v and 17w, and the inductances of the three inductors 20u, 20v and 20w are set in this manner, a surge current at a specific frequency flows into the motor case 31 via the inductors 20u, 20v and 20w and the housing connection wire 18, and returns to the inverter device 34 via the shielding layer 23, resulting in a reduction of the surge noise.

The conductive path A with noise filter of Embodiment 1 includes the U-phase wire 11u, the V-phase wire 11v and the W-phase wire 11w, which serve as the conductive path main body, and the U-phase inductor 20u, the V-phase inductor 20v and the W-phase inductor 20w, which have a coil shape and are surrounding the U-phase wire 11u, the V-phase wire 11v and the W-phase wire 11w, respectively. The conductive path A with noise filter further includes the U-phase capacitor 17u arranged between the U-phase wire flu and the U-phase inductor 20u, the V-phase capacitor 17v arranged between the V-phase wire 11v and the V-phase inductor 20v, and the W-phase capacitor 17w arranged between the W-phase wire 11w and the W-phase inductor 20w. Setting the electrostatic capacitances of the capacitors 17u, 17v and 17w, and setting the inductances of the inductors 20u, 20v and 20w as described above make it possible to effectively reduce the surge noise in a specific frequency band due to an LC resonance.

The three wires, namely the U-phase wire 11u, the V-phase wire 11v and the W-phase wire 11w, are arranged in parallel and provided with the U-phase inductor 20u, the V-phase inductor 20v and the W-phase inductor 20w, respectively. In this case, there is a concern that the inductors 20u, 20v and 20w are short-circuited with one another, but, in Embodiment 1, each of the inductors 20u, 20v and 20w is obtained by coating the conductive wire 21 with the insulating layer 22, thus making it possible to prevent the inductors 20u, 20v and 20w from coming into contact with one another without using dedicated insulating members. Furthermore, the conductive wire 21 is a metal single-core wire having an ability to retain its shape by itself, thus making it possible to keep the inductors 20u, 20v and 20w in a predetermined coil shape without using other members.

The conductive path A with noise filter of Embodiment 1 includes the housing connection wire 18 for connecting the conductive layers 16u, 16v and 16w to the housing ground 40 (motor case 31), and this housing connection wire 18 is provided with the three inductors 20u, 20v and 20w. With this configuration, a surge current flows into the housing 40 (motor case 31) via the housing connection wire 18, and returns to the inverter device 34 via the shielding layer 23, resulting in an effective reduction of the surge noise.

The capacitors 17u, 17v and 17w and the inductors 20u, 20v and 20w are arranged inside the shielded space 24, which is a dead space inside the shielding layer 23. Accordingly, the size can be reduced compared with a case where the capacitors 17u, 17v and 17w and the inductors 20u, 20v and 20w are provided on the outside of the shielding layer 23.

The capacitors 17u, 17v and 17w each include the conductive path main body (the U-phase wire 11u, the V-phase wire 11v, the W-phase wire 11w), the insulating layer (the U-phase insulating coating 12u, the V-phase insulating coating 12v, the W-phase insulating coating 12w) that surrounds the conductive path main body (the U-phase wire 11u, the V-phase wire 11v, the W-phase wire 11w), and the conductive layer (the U-phase conductive layer 16u, the V-phase conductive layer 16v, the W-phase conductive layer 16w) that is provided to correspond to the conductive path main body (the U-phase wire 11u, the V-phase wire 11v, the W-phase wire 11w) with the the insulating layer (U-phase insulating coating 12u, the V-phase insulating coating 12v, the W-phase insulating coating 12w) being sandwiched therebetween. With this configuration, the capacitors 17u, 17v and 17w include no lead wires, thus making it unnecessary to connect lead wires to the U-phase wire 11u, the V-phase wire 11v and the W-phase wire 11w.

Embodiment 2

Figure 4:
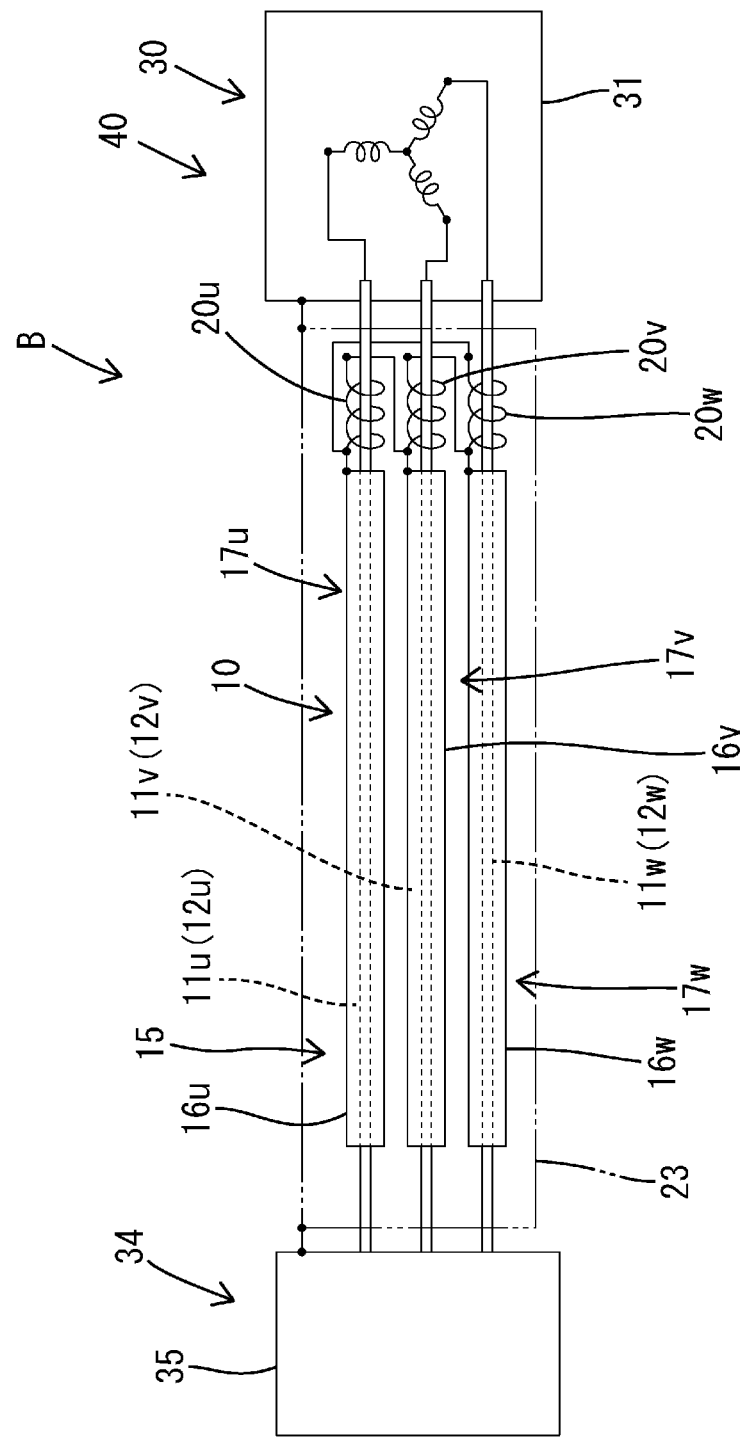
FIG. 4 is a configuration diagram of a conductive path with noise filter of Embodiment 2.

Next, Embodiment 2 will be described with reference to FIG. 4. A conductive path B with noise filter of Embodiment 2 has a configuration in which the three inductors 20u, 20v and 20w are connected in a way different from that in Embodiment 1 above. Other structural aspects are identical to those of Embodiment 1 above. Therefore, identical structural aspects are denoted by identical reference numerals, and descriptions of the structures, functions, and effects are omitted.

In Embodiment 1 above, the housing connection wire 18 for connecting the U-phase capacitor 17u (U-phase conductive layer 16u), the V-phase capacitor 17v (V-phase conductive layer 16v) and the W-phase capacitor 17w (W-phase conductive layer 16w) to the motor case 31 is provided, and the three branch wires 19u, 19v and 19w of this housing connection wire 18 are provided with the U-phase inductor 20u, the V-phase inductor 20v, and the W-phase inductor 20w, respectively.

In contrast, in Embodiment 2, the housing connection wire 18 is not provided, the U-phase capacitor 17u and the V-phase capacitor 17v are connected via the U-phase inductor 20u, the V-phase capacitor 17v and the W-phase capacitor 17w are connected via the V-phase inductor 20v, and the W-phase capacitor 17w and the U-phase capacitor 17u are connected via the W-phase inductor 20w. That is, the three inductors 20u, 20v and 20w are delta-connected. At the end portions on the motor 30 side of the U-phase wire 11u, the V-phase wire 11v and the W-phase wire 11w, neither the three capacitors 17u, 17v and 17w (conductive layers 16u, 16v and 16w) nor the three inductors 20u, 20v and 20w are connected to the housing ground 40.

The conductive path B with noise filter of Embodiment 2 includes the U-phase wire 11u, the V-phase wire 11v and the W-phase wire 11w, which constitute the three-phase AC circuit 10; the U-phase inductor 20u, the V-phase inductor 20v and the W-phase inductor 20w, which respectively surround the U-phase wire 11u, the V-phase wire 11v and the W-phase wire 11w; and the three capacitors 17u, 17v and 17w, which are respectively connected to the three inductors 20u, 20v and 20w. The three capacitors 17u, 17v and 17w (conductive layers 16u, 16v and 16w) are mutually connected via the inductors 20u, 20v and 20w.

The conductive layers 16u, 16v and 16w included in the three capacitors 17u, 17v and 17w are connected to only the inductors 20u, 20v and 20w. Each of the three inductors 20u, 20v and 20w is connected to only one of the three capacitors 17u, 17v and 17w (conductive layers 16u, 16v and 16w) and one of the remaining two inductors. With this configuration, a surge current in each of the wires 11u, 11v and 11w can be attenuated by the capacitors 17u, 17v and 17w and the inductors 20u, 20v and 20w, and discharged to the other conductive layers 16u, 16v and 16w, thus making it possible to reduce a common mode noise, which is of concern when the conductive layers 16u, 16v and 16w and the inductors 20u, 20v and 20w are connected to the housing ground 40 (motor case 31).

Embodiment 3

Figure 5:
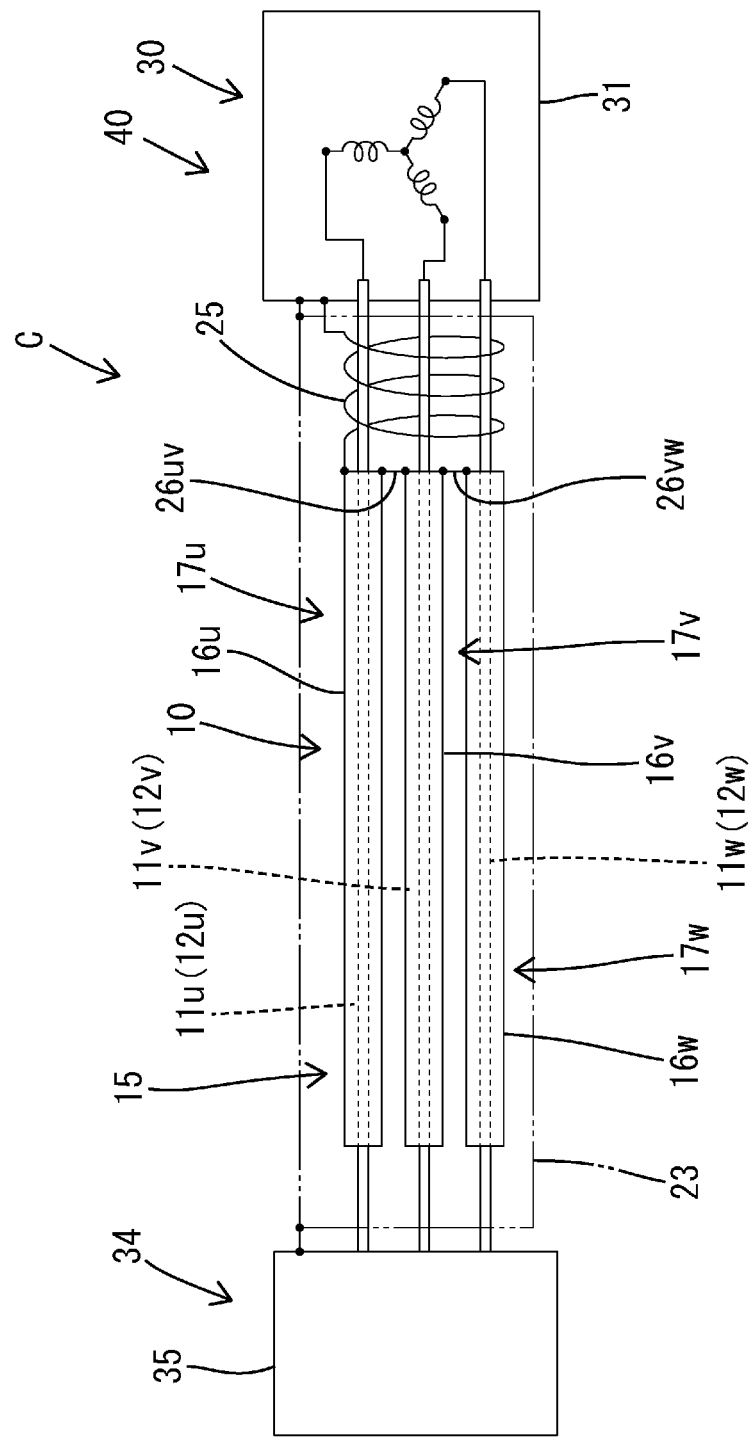
FIG. 5 is a configuration diagram of a conductive path with noise filter of Embodiment 3.

Next, Embodiment 3 will be described with reference to FIG. 5. A conductive path with noise filter C of Embodiment 3 has a configuration that differs from that of Embodiment 1 above in that an inductor 25 is used. Other structural aspects are identical to those of Embodiment 1 above. Therefore, identical structural aspects are denoted by identical reference numerals, and descriptions of the structures, functions, and effects are omitted.

In Embodiment 1 above, the three inductors, namely the U-phase inductor 20u, the V-phase inductor 20v and the W-phase inductor 20w, are provided, and the U-phase inductor 20u, the V-phase inductor 20v and the W-phase inductor 20w surround the U-phase wire 11u, the V-phase wire 11v and the W-phase wire 11w, respectively. In contrast, in Embodiment 3, the number of the inductor 25 is set to one, and this one inductor 25 surrounds the three wires, namely the U-phase wire 11u, the V-phase wire 11v and the W-phase wire 11w, all together in a spiral manner. One end of this coil-shaped inductor 25 is connected to the motor case 31. The other end of the inductor 25 is connected to the end on the motor 30 side of the U-phase conductive layer 16u of the U-phase capacitor 17u.

The end on the motor 30 side of the U-phase conductive layer 16u of the U-phase capacitor 17u and the end on the motor 30 side of the V-phase conductive layer 16v of the V-phase capacitor 17v are connected via an inter-phase connection wire 26uv. The end on the motor 30 side of the V-phase conductive layer 16v of the V-phase capacitor 17v and the end on the motor 30 side of the W-phase conductive layer 16w of the W-phase capacitor 17w are connected via an inter-phase connection wire 26vw.

In the conductive path with noise filter C of Embodiment 3, the three wires, namely the U-phase wire 11u, the V-phase wire 11v and the W-phase wire 11w, are arranged in parallel, and the three capacitors, namely the U-phase capacitor 17u, the V-phase capacitor 17v and the W-phase capacitor 17w, which are connected in parallel, are provided on the three wires, namely the U-phase wire 11u, the V-phase wire 11v and the W-phase wire 11w, respectively. One inductor 25 surrounds the three wires, namely the U-phase wire 11u, the V-phase wire 11v and the W-phase wire 11w, all together, and is connected to the three capacitors, namely the U-phase capacitor 17u, the V-phase capacitor 17v and the W-phase capacitor 17w. With this configuration, it is sufficient that only one inductor 25 is used for the three conductive path main bodies (i.e., the U-phase wire 11u, the V-phase wire 11v and the W-phase wire 11w), thus making it possible to reduce the number of components.

Embodiment 4

Figure 6:
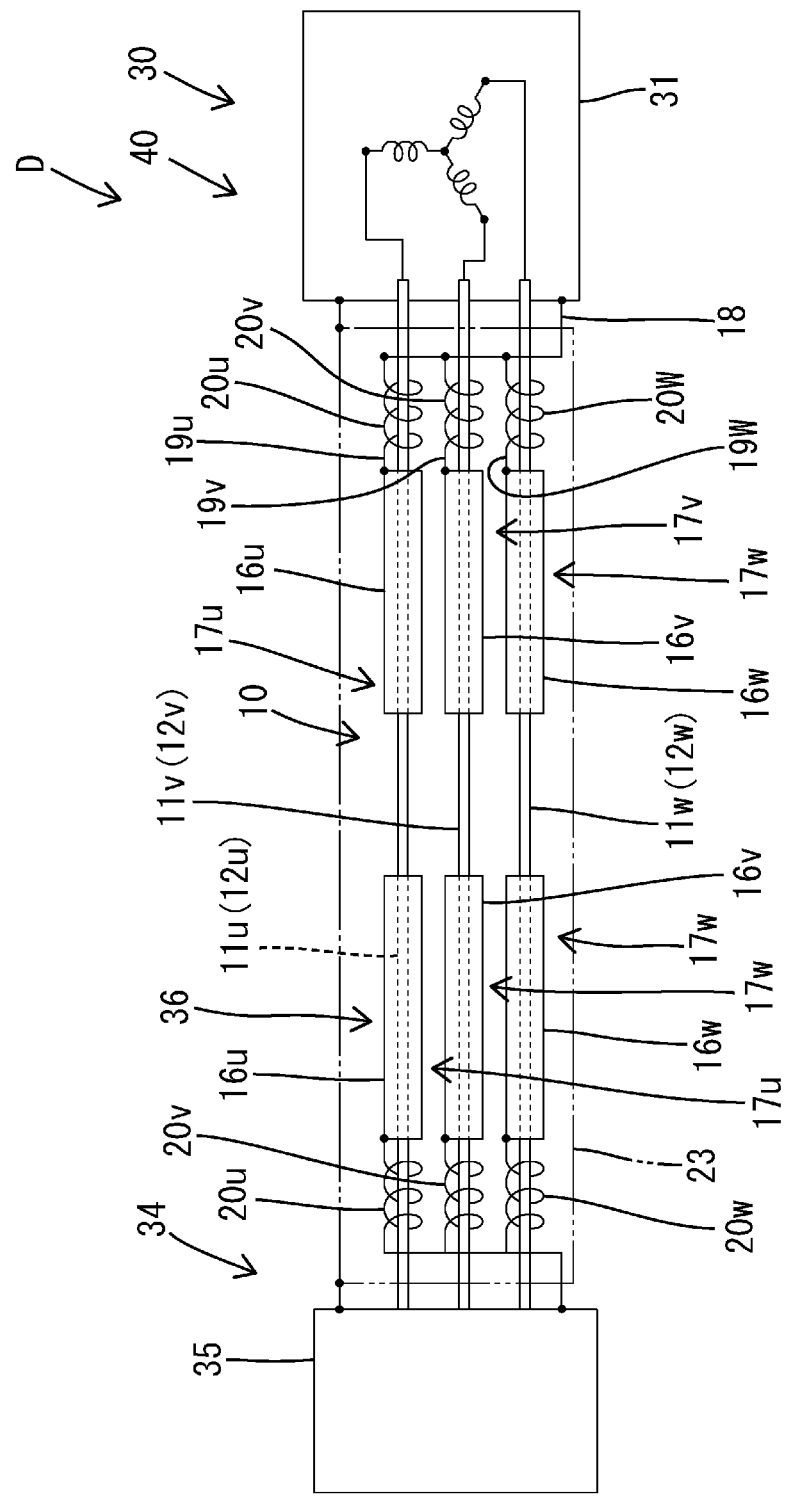
FIG. 6 is a configuration diagram of a conductive path with noise filter of Embodiment 4.

Next, Embodiment 4 will be described with reference to FIG. 6. A conductive path with noise filter D of Embodiment 4 has a configuration that differs from that of Embodiment 1 above in that a surge reducing filter 36 is used. Other structural aspects are identical to those of Embodiment 1 above. Therefore, identical structural aspects are denoted by identical reference numerals, and descriptions of the structures, functions, and effects are omitted.

The surge reducing filter 36 of Embodiment 4 includes two separate U-phase conductive layers 16u, one of which is located on the motor 30 side and the other of which is located on the inverter device 34 side, two separate V-phase conductive layers 16v, one of which is located on the motor 30 side and the other of which is located on the inverter device 34 side, and two separate W-phase conductive layers 16w, one of which is located on the motor 30 side and the other of which is located on the inverter device 34 side. The U-phase conductive layer 16u, the V-phase conductive layer 16v and the W-phase conductive layer 16w located on the motor 30 side are not directly connected to the U-phase conductive layer 16u, the V-phase conductive layer 16v and the W-phase conductive layer 16w located on the inverter device 34 side, respectively. The U-phase wire 11u, the V-phase wire 11v and the W-phase wire 11w respectively include two separate U-phase capacitors 17u, one of which is located on the motor 30 side and the other of which is located on the inverter device 34 side, two separate V-phase capacitors 17v, one of which is located on the motor 30 side and the other of which is located on the inverter device 34 side, and two separate W-phase capacitors 17w, one of which is located on the motor 30 side and the other of which is located on the inverter device 34 side.

Furthermore, the surge reducing filter 36 of Embodiment 4 also includes three inductors 20u, 20v and 20w that are respectively connected to the U-phase conductive layer 16u, the V-phase conductive layer 16v and the W-phase conductive layer 16w located on the motor 30 side, and three inductors 20u, 20v and 20w that are respectively connected to the U-phase conductive layer 16u, the V-phase conductive layer 16v and the W-phase conductive layer 16w located on the inverter device 34 side. The three inductors 20u, 20v and 20w located on the motor 30 side are star-connected, and are connected to the housing ground 40 (motor case 31) via a housing connection wire 18. The three inductors 20u, 20v and 20w located on the inverter device 34 side are star-connected, and are connected to the housing ground 40 (inverter case 35) via a housing connection wire 18.

Other Embodiments

The present invention is not limited to the embodiments that have been described above with reference to the drawings, and embodiments such as those described below are also included in the technical scope of the present invention, for example.

Although, in Embodiments 1 to 4 above, the capacitors each include the conductive path main body, the insulating layer surrounding the conductive path main body, and the conductive layer provided to correspond to the conductive path main body with the insulating layer being sandwiched therebetween, each of the capacitors may also include a lead wire that is to be connected to the conductive path main body.

Although, in Embodiments 1 to 4 above, the shielding layer surrounds the plurality of conductive path main bodies all together, a configuration in which such a shielding layer is not provided may also be possible.

Although, in Embodiments 1, 3 and 4 above, the three conductive path main bodies constituting the three-phase AC circuit are star-connected, the present invention can also be applied to a case where three conductive path main bodies constituting a three-phase AC circuit are delta-connected. The present invention can also be applied to a case where the delta-connection is changed to star-connection in Embodiment 2.

Although, in Embodiments 1 to 4 above, the three conductive path main bodies constitute the three-phase AC circuit, the present invention can also be applied to a case where the conductive path main bodies do not constitute a three-phase AC circuit.

Although, in Embodiments 1 to 4 above, the number of the conductive path main bodies is three, the present invention can also be applied to a case where the number of the conductive path main bodies is one, two, or four or more.

Although, in Embodiments 1 to 4 above, the flexible stranded wires or single-core wires having a circular cross section are used as the conductive path main bodies, busbars that are not deformed easily, flat cables in which a plurality of electric wires are arranged in parallel, or the like may also be used.

Although, in Embodiments 1 to 4 above, each of the insulating layers are integrated with the outer circumference of the conductive path main body and included in the coated wire, each of the insulating layers may also be integrated with the inner circumference of the conductive layer, or arranged between the outer circumference of the conductive path main body and the inner circumference of the conductive layer so as to be capable of being displaced relatively.

Although, in Embodiments 1 to 4 above, the conductive path with noise filter is arranged between the motor and the inverter device, the present invention can also be applied to a case where the conductive path with noise filter is to be connected to devices other than the motor and the inverter device.

Although, in Embodiments 1, 3 and 4 above, the housing connection wire is connected to the motor case, the housing connection wire may also be connected to not the motor case but the vehicle body (ground) directly.

Although, in Embodiments 1 to 4 above, the inductors have a configuration in which the conductive wire is coated with the insulating layer, the inductors may also have a configuration in which the conductive wire is exposed. In this case, it is necessary to provide insulating members for preventing the inductors from coming into contact with each other and preventing the inductors from coming into contact with the shielding layer.

Although, in Embodiments 1 to 4 above, the single-core wires are used as the conductive wires of the inductors, stranded wires may also be used as the conductive wires.

Although, in Embodiments 1 to 4 above, each of the conductive layers corresponds to the conductive path main body and surrounds the entire circumference thereof, each of the conductive layers may be configured to correspond to only a partial region of the conductive path main body in a circumferential direction.

Although, in Embodiments 1 to 3 above, the inductors are arranged on only the motor side and connected to only the motor case, inductors may also be provided on the inverter device side in addition to the inductors on the motor side, and connected to the inverter case.

Although, in Embodiments 1 to 4 above, the conductive layers are made of metal having a tubular shape, sheet-like or tape-like metal foils, braided wires, metal busbars, metal stranded wires, metal single-core wires, core materials with a plated surface, conductive resins, conductive rubbers, or the like may also be used.

Although, in Embodiments 1 to 4 above, the metal single-core wires are used as the inductors, metal stranded wires may also be used as the inductors.

Although, in Embodiments 1 to 4 above, the conductive layers are directly connected to only the inductors, there is no limitation thereto. Components such as resistances that independently exhibit a noise filtering function, components that exhibit a noise filtering function together with the conductive layers and the inductors, or the like may also be connected to the conductive layers in parallel with the inductors.

It is to be understood that the foregoing is a description of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example," "e.g.," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

LIST OF REFERENCE NUMERALS

A, B, C, D . . . Conductive path with noise filter
10 . . . Three-phase AC circuit
11$u$ . . . U-phase wire (conductive path main body)
11$v$ . . . V-phase wire (conductive path main body)
11$w$ . . . W-phase wire (conductive path main body)
12$u$ . . . U-phase insulating coating (insulating layer)
12$v$ . . . V-phase insulating coating (insulating layer)
12$w$ . . . W-phase insulating coating (insulating layer)
16$u$ . . . U-phase conductive layer (conductive layer)

16v . . . V-phase conductive layer (conductive layer)
16w . . . W-phase conductive layer (conductive layer)
17u . . . U-phase capacitor (capacitor)
17v . . . V-phase capacitor (capacitor)
17w . . . W-phase capacitor (capacitor)
20u . . . U-phase inductor (inductor)
20v . . . V-phase inductor (inductor)
20w . . . W-phase inductor (inductor)
21 . . . Conductive wire
22 . . . Insulating layer
23 . . . Shielding layer
24 . . . Shielded space
25 . . . Inductor

The invention claimed is:

1. A conductive path with a noise filter comprising:
three conductive path main bodies constituting a three-phase AC circuit;
three coil-shaped inductors respectively surrounding the three conductive path main bodies; and
three capacitors respectively arranged between the three conductive path main bodies and the three inductors, and respectively connected to the three inductors,
wherein the three capacitors each include a conductive layer and are mutually connected via the inductors,
the conductive layer of each of the three capacitors is directly connected to only the inductors,
each of the inductors is directly connected to only one or two of the three capacitors and at least one of the remaining two inductors,
a plurality of the conductive path main bodies are arranged in parallel,
the plurality of the conductive path main bodies are each provided with at least one of the three inductors, and
each of the three inductors is a conductive wire coated with an insulating layer.

2. The conductive path with the noise filter according to claim 1, wherein the conductive wire is a metal single-core wire.

3. A conductive path with a noise filter comprising:
three conductive path main bodies constituting a three-phase AC circuit;
three coil-shaped inductors respectively surrounding the three conductive path main bodies; and
three capacitors respectively arranged between the three conductive path main bodies and the three inductors, and respectively connected to the three inductors,
wherein the three capacitors each include a conductive layer and are mutually connected via the inductors,
the conductive layer of the three capacitors is directly connected to only the inductors,
each of the inductors is directly connected to only one or two of the three capacitors and at least one of the remaining two inductors,
a tubular shielding layer surrounds a plurality of the conductive path main bodies and the inductors all together, and
the three capacitors are arranged inside a shielded space surrounded by the shielding layer.

4. A conductive path with a noise filter comprising:
three conductive path main bodies constituting a three-phase AC circuit;
three coil-shaped inductors respectively surrounding the three conductive path main bodies; and
three capacitors respectively arranged between the three conductive path main bodies and the three inductors, and respectively connected to the three inductors,
wherein the three capacitors each include a conductive layer and are mutually connected via the inductors,
the conductive layer of the three capacitors is directly connected to only the inductors,
each of the inductors is directly connected to only one or two of the three capacitors and at least one of the remaining two inductors,
each of the capacitors includes:
one of the conductive path main bodies;
an insulating layer surrounding the conductive path main body; and
the conductive layer provided to correspond to the conductive path main body with the insulating layer being sandwiched between the conductive layer and the conductive path main body.

* * * * *